(12) United States Patent
Son et al.

(10) Patent No.: US 11,899,073 B2
(45) Date of Patent: Feb. 13, 2024

(54) HIGH-PRECISION IMPEDANCE MEASUREMENT DEVICE

(71) Applicant: MINTECH CO., LTD, Daejeon (KR)

(72) Inventors: Hyung Bin Son, Seoul (KR); Young Jae Lee, Daejeon (KR); Gyeong Rin Choi, Gwangju (KR); Young Jin Hong, Daejeon (KR)

(73) Assignee: Mintech Co., LTD, Daejeon (KR)

( * ) Notice: Subject to any disclaimer, the term of this patent is extended or adjusted under 35 U.S.C. 154(b) by 91 days.

(21) Appl. No.: 17/435,027

(22) PCT Filed: Sep. 22, 2020

(86) PCT No.: PCT/KR2020/012767
§ 371 (c)(1),
(2) Date: Aug. 30, 2021

(87) PCT Pub. No.: WO2021/075744
PCT Pub. Date: Apr. 22, 2021

(65) Prior Publication Data
US 2022/0137144 A1    May 5, 2022

(30) Foreign Application Priority Data
Oct. 14, 2019   (KR) .................. 10-2019-0126959

(51) Int. Cl.
*G01R 31/389* (2019.01)
*H03F 3/04* (2006.01)

(52) U.S. Cl.
CPC .............. *G01R 31/389* (2019.01); *H03F 3/04* (2013.01)

(58) Field of Classification Search
None
See application file for complete search history.

(56) References Cited

U.S. PATENT DOCUMENTS

| 4,535,294 A | * | 8/1985 | Ericksen | ............ | H03K 3/02337 |
| | | | | | 326/62 |
| 2005/0021254 A1 | * | 1/2005 | Merl | .................... | G01R 31/389 |
| | | | | | 702/65 |

(Continued)

FOREIGN PATENT DOCUMENTS

| JP | H0973923 A | 3/1997 |
| JP | 2014046028 A1 | 3/2014 |

(Continued)

OTHER PUBLICATIONS

International Search Report for PCT/KR2020/012767 completed Dec. 24, 2020 (4 pages).

(Continued)

*Primary Examiner* — Jas A Sanghera
(74) *Attorney, Agent, or Firm* — Invention Mine LLC

(57) ABSTRACT

An impedance measurement device of the present disclosure includes: an electrochemical energy device; an amplifier connected to each connection terminal of the electrochemical energy device and configured to amplify a signal introduced into a wiring; and a main board configured to receive the signal from the amplifier and measure an impedance. Accordingly, the present invention has advantages in that high resistance to electromagnetic interference may be achieved by disposing a preamplifier close to a terminal of an electrochemical energy device to amplify only the signal without amplifying a noise introduced into a wiring.

3 Claims, 4 Drawing Sheets

(56) References Cited

U.S. PATENT DOCUMENTS

| | | | |
|---|---|---|---|
| 2007/0090801 A1 | 4/2007 | Kim | |
| 2011/0068866 A1* | 3/2011 | Kishii | H03F 1/0211 |
| | | | 330/129 |
| 2021/0018567 A1* | 1/2021 | Horiguchi | G01R 31/396 |

FOREIGN PATENT DOCUMENTS

| | | |
|---|---|---|
| KR | 20040010528 A | 1/2004 |
| KR | 20050054449 A | 6/2005 |
| KR | 20060107473 A | 10/2006 |
| KR | 20180122385 | 11/2018 |

OTHER PUBLICATIONS

Extended European Search Report for PCT/KR2020/012767 completed Apr. 5, 2022 (8 pages).

* cited by examiner

HIGH-PRECISION IMPEDANCE MEASUREMENT DEVICE

CROSS-REFERENCE TO RELATED APPLICATIONS

The present application is a national stage application, which claims benefit under 35 U.S.C. § 365 of International Application No. PCT/KR2020/012767, entitled "HIGH-PRECISION IMPEDANCE MEASUREMENT DEVICE" and filed Sep. 22, 2020, which was published on Apr. 22, 2021 and which is hereby incorporated by reference in its entirety and which claims benefit from Korean Patent Application Serial No. 10-2019-0126959, filed Oct. 14, 2019.

TECHNICAL FIELD

The present disclosure relates to a high-precision impedance measurement device, and more particularly, to a high-precision impedance measurement device in which a preamplifier is disposed close to a terminal of an electrochemical energy device to amplify only signals, without amplifying a noise introduced into a wiring, thereby having high resistance against electromagnetic interference.

DISCUSSION OF RELATED ART

An energy storage system (ESS) is a potential tool for increasing energy efficiency on the demand side by reducing the maximum load without causing inconvenience to customers. Home energy storage devices are being developed and marketed by several manufacturers. Although the high cost of the device acts as a constraint on consumables, ESSs are beginning to be adopted for home energy management because of their small size and ease of control.

As these next-generation power technologies are disseminated, there is an increasing demand for measuring the state of large-capacity, high-voltage electrochemical energy devices used therein.

Since the large-capacity electrochemical energy devices have a high operating voltage (~several hundreds of V) and significantly low internal impedance (several to several tens of mΩ) due to their characteristics, an impedance measurement device for them should precisely measure significantly small changes in AC voltage (tens of μV).

For such precise measurement, electromagnetic interference (EMI) rejection (e.g., elimination) and a high common-mode rejection ratio are required.

In order to eliminate electromagnetic interference, wirings connecting the electrochemical energy device and the impedance measurement device should be shortened as much as possible and careful attention should be paid to electromagnetic interference shielding, but since there is a minimum separation distance between a measurement equipment room and the electrochemical energy device for the safe operation of the system, it is difficult to completely shield electromagnetic interference.

In addition, high-cost components are required to obtain a high common-mode rejection ratio under high-voltage operating conditions, and safety problems may occur because the measurement wirings may be exposed to high-voltage.

DETAILED DESCRIPTION OF THE INVENTION

Technical Objects

Embodiments of the present disclosure are directed to a high-precision impedance measurement device that disposes a preamplifier close to a terminal of an electrochemical energy device to amplify only signals without amplifying noise introduced into a wiring, thereby having high resistance against electromagnetic interference.

Embodiments of the present disclosure are also directed to a high-precision impedance measurement device capable of achieving a high common-mode rejection ratio by using an isolation amplifier.

Embodiments of the present disclosure are also directed to a high-precision impedance measurement device capable of improving safety since a measurement wiring operates at a low voltage.

Embodiments of the present disclosure are also directed to a high-precision impedance measurement device allowing miniaturization and cost reduction since an isolation amplifier instead of a high-voltage capacitor is responsible for insulation.

The objects of the present disclosure are not limited to the objects mentioned above, and other objects and advantages of the present disclosure not mentioned may be understood by the following description and will be more clearly understood by embodiments of the present disclosure. It will also be readily apparent that the objects and advantages of the present disclosure may be realized by the means and combinations thereof indicated in the appended claims.

Technical Solution to the Problem

According to an embodiment, an impedance measurement device includes: an electrochemical energy device; an amplifier connected to each connection terminal of the electrochemical energy device and configured to remove a DC signal of a signal introduced through a wiring, allow an AC signal of the signal to pass therethrough, and amplify and provide the AC signal; and a main board configured to receive the AC signal from the amplifier and measure an impedance of the AC signal.

Effects of the Invention

According to one or more embodiments of the present disclosure, by disposing a preamplifier close to a terminal of an electrochemical energy device to amplify only signals without amplifying noise introduced into a wiring, the impedance measuring device may have high resistance against electromagnetic interference.

In addition, according to one or more embodiments of the present disclosure, there is an advantage that a high common-mode rejection ratio may be achieved by using an isolation amplifier.

In addition, according to one or more embodiments of the present disclosure, there is an advantage that safety may be improved because a measurement wiring is operated at a low voltage.

In addition, according to one or more embodiments of the present disclosure, since an isolation amplifier is in charge of insulation instead of a high-voltage capacitor, there is an advantage in that miniaturization and cost reduction are possible.

PREFERRED MODES FOR IMPLEMENTATION OF THE INVENTION

Figure 1:
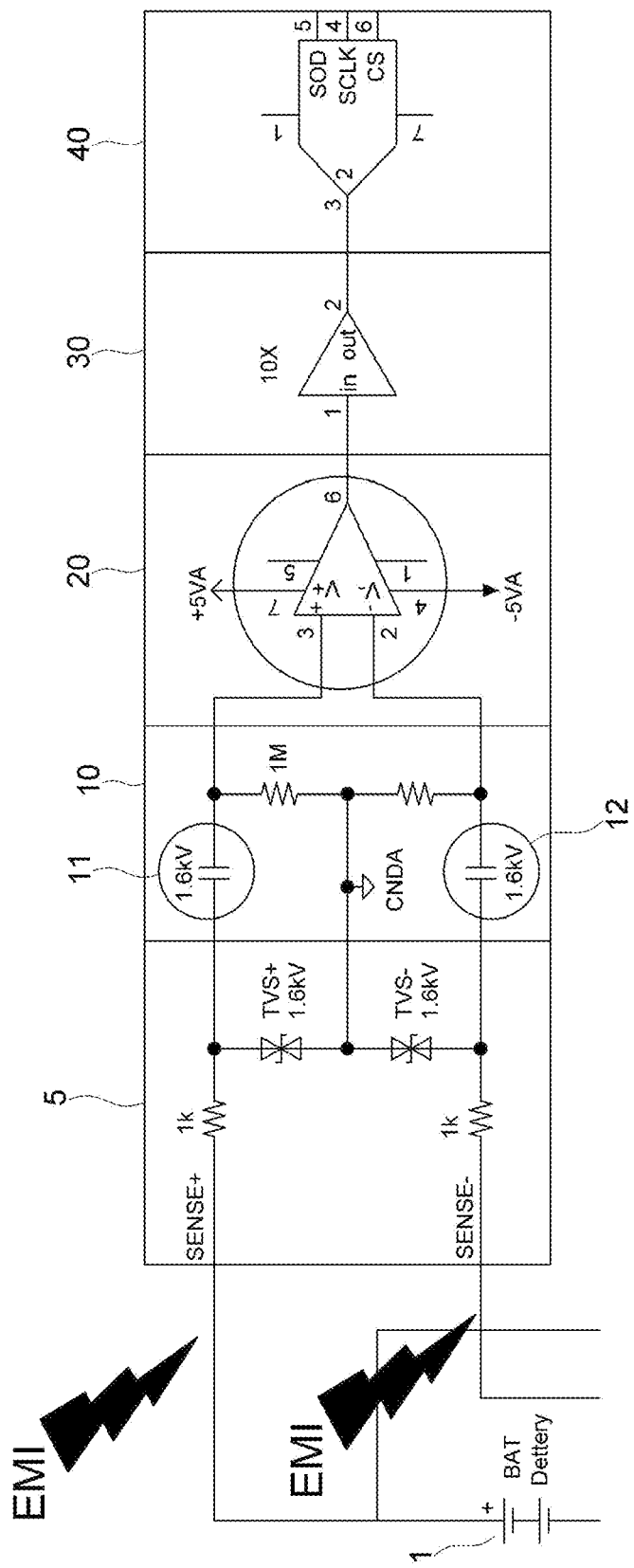
FIG. 1 is a block diagram for explaining a conventional high-voltage AC impedance analyzer.

According to an embodiment, an impedance measurement device includes:
- an electrochemical energy device;
- an amplifier connected to each connection terminal of the electrochemical energy device and configured to remove a DC signal of a signal introduced through a wiring, allow an AC signal of the signal to pass therethrough, and amplify and provide the AC signal; and
- a main board configured to receive the AC signal from the amplifier and measure an impedance of the AC signal.

According to an embodiment, in the impedance measurement device, the amplifier includes:
- a DC blocking portion configured to remove a DC signal of a signal of a power applied from the electrochemical energy device and allow an AC signal of the signal to pass therethrough;
- a first amplifier configured to amplify the AC signal; and
- a second amplifier configured to provide the signal amplified by the first amplifier to the main board.

According to an embodiment, in the impedance measurement device, the first amplifier amplifies only the AC signal and does not amplify a common-mode noise introduced through a wiring.

According to an embodiment, in the impedance measurement device, the main board includes:
- a power supply configured to provide a power;
- a voltage measurement channel configured to measure a voltage for the AC signal received from the amplifier when receiving the AC signal from the amplifier;
- a current measurement channel configured to measure a current for the AC signal received from the amplifier when receiving the AC signal from the amplifier; and
- an impedance calculator configured to calculate an impedance by using the voltage for the AC signal and the current for the AC signal.

According to an embodiment, in the impedance measurement device, when the amplifiers are provided in plural, the main board is capable of performing multi-channel measurement by using signals received from each of the plurality of amplifiers.

[Forms for Implementation of the Invention]

The above-described objects, features and advantages will be described below in detail with reference to the accompanying drawings, and accordingly, those skilled in the art to which the present disclosure pertains will be able to easily implement the technical idea of the present disclosure. In describing the present disclosure, if it is determined that a detailed description of a known technology related to the present disclosure may unnecessarily obscure the gist of the present disclosure, the detailed description will be omitted. Hereinafter, preferred embodiments according to the present disclosure will be described in detail with reference to the accompanying drawings. In the drawings, the same reference numerals are used to indicate the same or similar components.

As used herein, the term "electrochemical energy device" may include a battery, a fuel cell, and the like.

FIG. 1 is a block diagram for explaining a conventional high-voltage AC impedance analyzer.

Referring to FIG. 1, a high-voltage AC impedance analyzer includes a signal input unit 5, a DC blocking portion 10, a first amplifier 20, a second amplifier 30 and an analog-digital converter 40.

The signal input unit 5 provides a power applied from an electrochemical energy device 1 to the DC blocking portion 10. In such a case, the power applied from the electrochemical energy device 1 includes a DC signal and an AC signal.

The DC blocking portion 10 removes the DC signal from the power applied from the electrochemical energy device 1 and provides only the AC signal to the first amplifier 20. That is, the DC blocking portion 10 removes the DC signal from the power applied from the signal input unit 5 such that only the AC signal may be provided to the first amplifier 20.

In general, a direct current varies with respect to the applied voltage according to a resistance, while an alternating current varies in terms of amplitude and phase with respect to the applied voltage and frequency according to an impedance, and thus the DC blocking portion 10 of the present disclosure is configured to remove the DC signal and allows the AC signal to pass therethrough, thereby allowing impedance analysis.

In the DC blocking portion 10, two capacitors 11 and 12 are formed to remove a common-mode noise when the common-mode noise is introduced from a wiring, and since the signal is provided to the second amplifier 30 through the first amplifier 20 after the common-mode noise is removed by the two capacitors 11 and 12, the second amplifier 30 may amplify only the signals introduced from the first amplifier 20 without the common-mode noise.

When the two capacitors 11 and 12 are not formed in the DC blocking portion 10 and the common-mode noise is introduced from the wiring, the common-mode noise is transmitted to the second amplifier 30 through the first amplifier 20 and amplified by the second amplifier 30. Accordingly, the two capacitors 11 and 12 should be formed in the DC blocking portion 10 to remove the common-mode noise introduced from the wiring.

The first amplifier 20 amplifies the signal according to a difference between a plurality of signals received from the DC blocking portion 10 and provides the amplified signal to the second amplifier 30. In such a case, the first amplifier 20 may be implemented as a differential amplifier.

When the first amplifier 20 is used, there is a problem that a low common-mode rejection ratio may be obtained when a high-frequency common-mode signal or an abrupt change in a common-mode voltage occurs.

Since the conventional first amplifier 20 is formed at an input end inside the high-voltage AC impedance analyzer, when the common-mode noise is introduced from the wiring, the common-mode noise and the plurality of signals received from the DC blocking portion 10 are amplified together and provided to the second amplifier 30.

That is, in a case where the common-mode noise is introduced from the wiring when the conventional first amplifier 20 amplifies the signal according to a difference between the plurality of signals received from the DC blocking portion 10, since the common-mode noise and the plurality of signals received from the DC blocking portion 10 are amplified together, in order to solve this problem, the plurality of capacitors 11 and 12 should be formed in the DC blocking portion 10.

In such a case, capacitors of high-capacity (several µF or more) and high-voltage (kV-level) should be used as the plurality of capacitors 11 and 12, and there is a problem that two capacitors are required to remove common-mode noise.

In addition, the plurality of capacitors 11 and 12 are used to amplify a high-voltage DC signal and a superimposed AC signal, and cost and space due to the use of the plurality of capacitors 11 and 12 become a major obstacle to multi-channelization.

As such, since the common-mode noise introduced by the wiring is removed by each of the plurality of capacitors 11 and 12 when the plurality of capacitors 11 and 12 are formed in the DC blocking portion 10, the first amplifier 20 may amplify the signal according to a difference between the plurality of signals received from the DC blocking portion 10 except for the common-mode noise.

However, when the plurality of capacitors 11 and 12 are formed in the DC blocking portion 10 to prevent the common-mode noise from being introduced into the first amplifier 20, it has a disadvantage that it requires a high cost.

The second amplifier 30 amplifies the signal received from the first amplifier 20 and provides it to the analog-digital converter 40. The analog-digital converter 40 converts an analog signal received from the second amplifier 30 into a digital signal and provides it.

Figure 2:
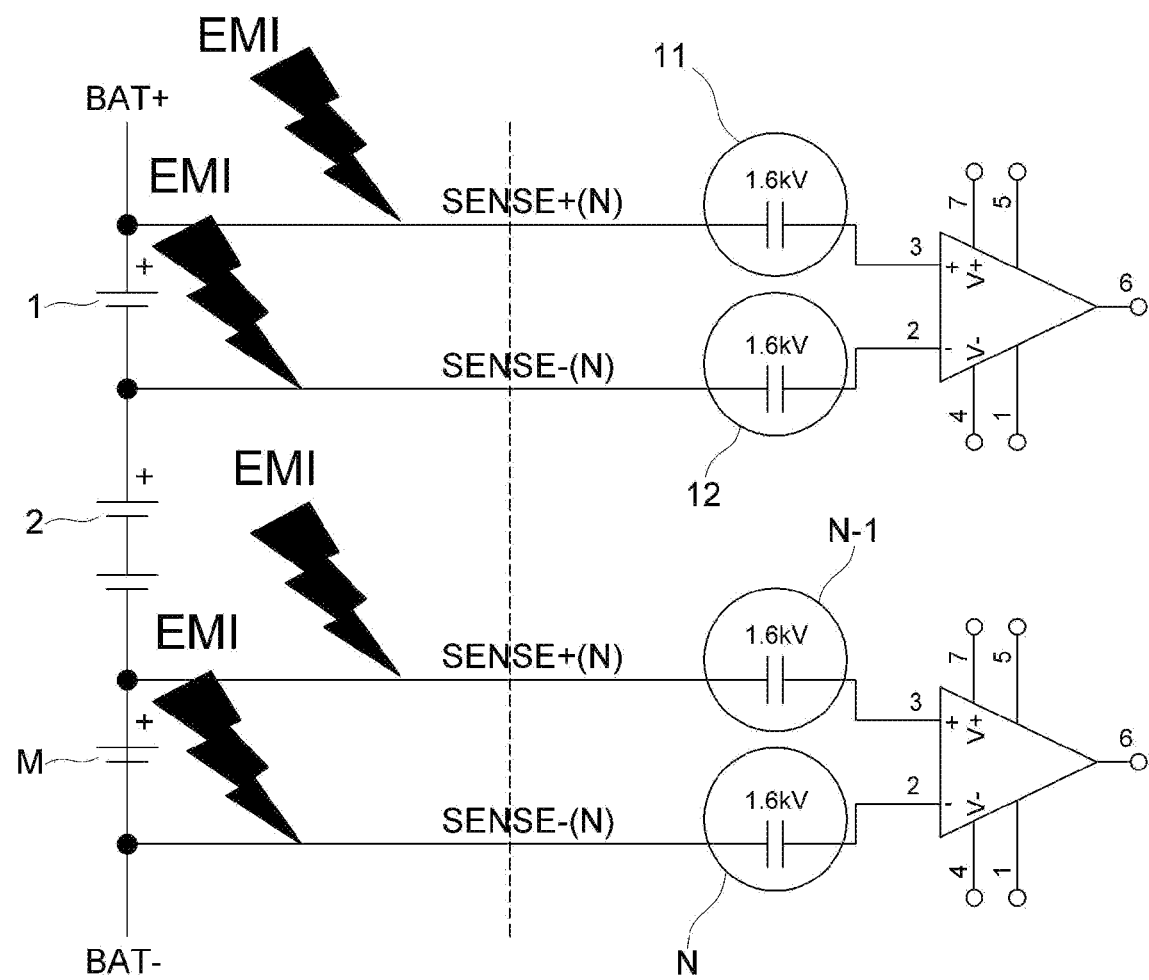
FIG. 2 is a block diagram for explaining a conventional high-voltage multi-channel AC impedance analyzer.

FIG. 2 is a block diagram for explaining a conventional high-voltage multi-channel AC impedance analyzer.

Referring to FIGS. 1 and 2, the high-voltage multi-channel AC impedance analyzer includes the DC blocking portion 10, the first amplifier 20, the second amplifier 30, and the analog-digital converter 40.

The DC blocking portion 10 removes a DC signal from a power applied from each of a plurality of electrochemical energy devices 1 to M and provides only an AC signal to the first amplifier 20. That is, the power applied from each of the plurality of electrochemical energy devices 1 to M includes a DC signal and an AC signal, and the DC blocking portion 10 connected to each of the plurality of electrochemical energy devices 1 to M removes a DC signal from the power and allows only the AC signal to be provided to the first amplifier 20.

The first amplifier 20 amplifies the signal according to a difference between the plurality of signals received from each of the DC blocking portion 10 and provides the amplified signal to the second amplifier 30. In such a case, the first amplifier 20 may be implemented as a preamplifier.

However, since the conventional first amplifier 20 is formed at an input end of the high-voltage AC impedance analyzer, the common-mode noise is introduced from the wiring, and after the plurality of signals received from the DC blocking portion 10 are amplified, the amplified signal and the common-mode noise are provided to the second amplifier 30.

That is, in a case where the common-mode noise is introduced from the wiring when the conventional first amplifier 20 amplifies the signal according to a difference between the plurality of signals received from each of the DC blocking portion 10, the common-mode noise is provided to the second amplifier 30 through the first amplifier 20 and then amplified, and in order to address such an issue, a plurality of capacitors 11 to N should be formed in each of the DC blocking portions 10.

Since there is one electrochemical energy device 1 in connection in FIG. 1, two capacitors 11 and 12 may be formed in each of the DC blocking portion 10, but in a case where there are a plurality of electrochemical energy devices 1 to M in connection as in FIG. 2, the number of the DC blocking portion 10 increases as much as the number of the plurality of electrochemical energy devices 1 to M, capacitors 11 to N as many as the number of the plurality of electrochemical energy devices×2 should be formed.

As described above, in a case where the capacitors 11 to N as many as the number of the plurality of electrochemical energy devices×2 are formed, the common-mode noise introduced by the wiring in each of the DC blocking portion 10 is removed, and thus the first amplifier 20 amplifies the signal according to a difference between the plurality of signals received from the DC blocking portion 10 and then provides only the amplified signal to the second amplifier 30.

However, in a case where the capacitors 11 to N as many as the number of the plurality of electrochemical energy devices×2 are formed in order to prevent the common-mode noise from being introduced into the first amplifier 20, there is a disadvantage in that a high cost is required due to the formation of the capacitors 11 to N as many as the number of the plurality of electrochemical energy devices×2.

The second amplifier 30 amplifies the signal received from the first amplifier 20 and provides it to the analog-digital converter 40. In a case where the plurality of capacitors 11 to N are not formed in each of the DC blocking portions 10, the common-mode noise is introduced into the second amplifier 30, and accordingly, there is a problem in that the second amplifier 30 amplifies the common-mode noise along with the signal received from the first amplifier 20.

Figure 3:
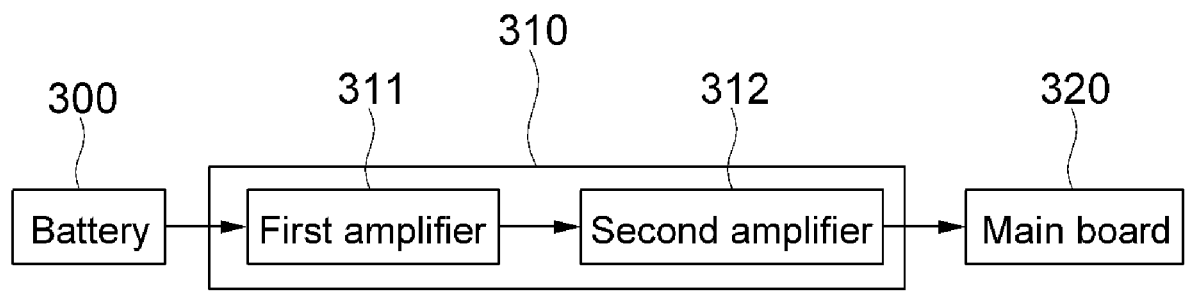
FIG. 3 is a block diagram for explaining an impedance measurement device according to an embodiment of the present disclosure.
Figure 4:
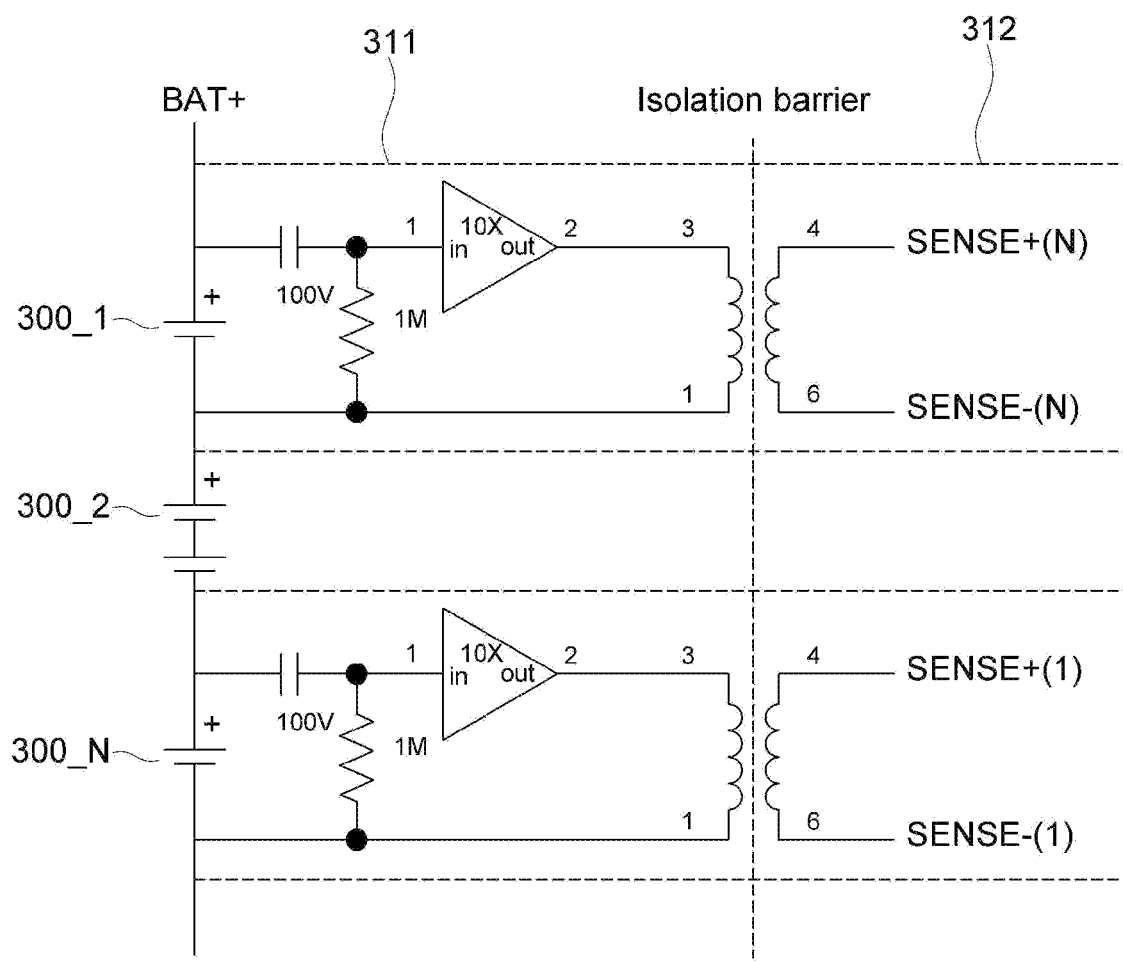
FIG. 4 is a circuit diagram for explaining an internal structure of an amplifier according to an embodiment of the present disclosure.

FIG. 3 is a block diagram for explaining an impedance measurement device according to an embodiment of the present disclosure. FIG. 4 is a circuit diagram for explaining an internal structure of an amplifier according to an embodiment of the present disclosure.

FIG. 3 illustrates a high-voltage AC impedance analyzer according to an embodiment of the present disclosure, and FIG. 4 illustrates a high-voltage multi-channel AC impedance analyzer according to another embodiment of the present disclosure.

Referring to FIGS. 3 and 4, an impedance measurement device includes an electrochemical energy device 300, an amplifier 310, and a main board 320. FIGS. 3 and 4 illustrate the electrochemical energy device 300 and the amplifier 310 separately according to an embodiment, but the electrochemical energy device 300 and the amplifier 310 may be illustrated as one element in embodiments.

The electrochemical energy device 300 is a device for supplying a power to the impedance measurement device. The electrochemical energy device 300 may include a battery, a fuel cell, and the like.

The amplifier 310 may operate by receiving a power from the electrochemical energy device 300 as well as the main board 320 or an external power source. One or more amplifiers 310 may be provided, and when a plurality of amplifiers 310 are present, the main board 320 may be connected thereto to enable simultaneous multi-channel measurement.

In an embodiment, when the amplifier 310 receives a power from the electrochemical energy device 300, the amplifier 310 is connected to each connection terminal of the electrochemical energy device 300 to amplify a signal introduced into a wiring, and then provides the amplified signal to the main board 320.

The amplifier 310 includes a DC blocking portion, a first amplifier 311, and a second amplifier 312.

The DC blocking portion removes a DC signal from the power applied from the electrochemical energy device 300 and allows only an AC signal to be provided to the first amplifier 311. That is, the DC blocking portion removes the DC signal from the power applied from the electrochemical energy device 300 to provide only the AC signal to the first amplifier 311.

The first amplifier 311 amplifies the AC signal received from the DC blocking portion and provides the amplified AC signal to the second amplifier 30. The first amplifier 311 may be implemented as a preamplifier.

In such a case, since the first amplifier 311 is disposed close to a terminal of the electrochemical energy device 300, it is possible to amplify only the AC signal received from the DC blocking portion without amplifying the common-mode noise introduced through the wiring.

That is, in embodiments of the present disclosure, dissimilar to the conventional examples of FIGS. 1 and 2, the amplifier (i.e., the first amplifier and the second amplifier) is removed from the inside of the impedance measurement device and disposed close to the terminal of the electrochemical energy device 300, and accordingly, the amplifier amplifies only the signal without amplifying the common-mode noise introduced into the wiring.

As such, by disposing the first amplifier 311 close to the terminal of the electrochemical energy device 300 to amplify the signal of the power applied from the electrochemical energy device 300 without amplifying the common-mode noise introduced through the wiring, it is possible to provide high resistance against electromagnetic interference.

In addition, in embodiments of the present disclosure, by disposing the first amplifier 311 close to the terminal of the electrochemical energy device 300 to amplify the signal of the power applied from the electrochemical energy device 300 without amplifying the common-mode noise introduced through the wiring, there is no noise issue, and it is unnecessary to remove the common-mode noise, and accordingly, it is unnecessary to form a plurality of capacitors 11 to N for removing the common-mode noise as in the conventional examples of FIGS. 1 and 2.

The second amplifier 312 provides the signal received from the first amplifier 311 to the main board 320. The second amplifier 312 may be implemented as an isolation amplifier (e.g., insulation amplifier).

The second amplifier 312 may be implemented to have different insulating capabilities according to the impedance measurement standard. For example, the second amplifier 312 may be implemented to have an insulation capability of 5000 V per minute. As another example, the second amplifier 312 may be implemented to have an insulation capability of 5000 V per minute according to the UL1577 standard.

Conventionally, the first amplifier 20 has been used to remove the common-mode noise, but this method has a problem in that it has a low common-mode rejection ratio when a high-frequency common-mode noise or an abrupt common-mode voltage change occurs.

However, according to embodiments of the present disclosure, the first amplifier 311 is disposed close to the terminal of the electrochemical energy device 300, so that the common-mode noise introduced into the wiring is not amplified and only the signal of the power applied from the electrochemical energy device 300 may be amplified.

The main board 320 measures an impedance by using the signal received from the amplifier 310. The main board 320 includes a power supply, a voltage measurement channel, a current measurement channel, and an impedance calculator.

The power supply supplies a power to the main board 320.

When the voltage measurement channel receives an AC signal from the amplifier 310, the voltage measurement channel measures a voltage for the AC signal received from the amplifier and provides it to the impedance calculator.

When the current measurement channel receives an AC signal from the amplifier 310, the current measurement channel measures a current for the AC signal received from the amplifier and provides it to the impedance calculator.

The impedance calculator calculates an impedance of the electrochemical energy device by using the voltage for the AC signal received from the voltage measurement channel and the current for the AC signal received from the current measurement channel.

In such a case, since the impedance calculator calculates the impedance by using the voltage for the AC signal received from the voltage measurement channel and the current for the AC signal received from the current measurement channel, if the AC current contains noise, there may be an error in the impedance value, and thus it is difficult to accurately determine a state of the electrochemical energy device.

However, in embodiments of the present disclosure, since the amplifier and the main board are separated from each other, and the preamplifier is disposed close to a terminal of the electrochemical energy device, only the signal may be amplified without amplifying the common-mode noise introduced through the wiring, and accordingly, it is possible to provide high resistance against electromagnetic interference.

As described above, when the main board 320 receives a signal from the amplifier 310 through the current application channel after the power is applied through the power supply, the main board 320 may measure the voltage of the signal through the voltage measurement channel and measure the current of the signal through the current measurement channel. Then, the main board 320 may calculate an impedance by using the voltage for the AC signal received from the voltage measurement channel and the current for the AC signal received from the current measurement channel.

Although the present disclosure has been described with reference to the limited embodiments and drawings, the present disclosure is not limited to the above embodiments, and those skilled in the art may conceive various modifications and variations based on the descriptions herein. Therefore, the inventive concept of the present disclosure should be understood only by the claims set forth below, and all equivalents or equivalent modifications thereof will fall within the scope of the spirit of the present disclosure.

INDUSTRIAL APPLICABILITY

According to embodiments of the present disclosure, by disposing a preamplifier close to a terminal of an electrochemical energy device to amplify only a signal without amplifying a noise introduced through a wiring, it is possible to have high resistance against electromagnetic interference.

REFERENCE NUMERALS 1, 300: Electrochemical energy device
5: Signal input
10: DC blocking portion
11, 12, 13 to N: Plurality of capacitors
20: First amplifier
30: Second amplifier
40: Analog-to-digital converter
310: Amplifier

311: First amplifier
312: Second amplifier
320: Main board

The invention claimed is:

1. An impedance measurement device comprising:
an electrochemical energy device;
an amplifier connected to each connection terminal of the electrochemical energy device and configured to remove a DC signal of a signal introduced through a wiring, allow an AC signal of the signal to pass therethrough, and amplify and provide the AC signal;
a main board configured to receive the AC signal from the amplifier and measure an impedance of the AC signal, and
wherein the amplifier comprises,
 a DC blocking portion configured to remove a DC signal of a signal of a power applied from the electrochemical energy device and allow an AC signal of the signal to pass therethrough;
 a first amplifier configured to be disposed close to the connection terminal of the electrochemical energy device to not amplify a common mode noise introduced through the wiring and to amplify the AC signal; and
 a second amplifier configured to be isolated from the first amplifier and to provide the signal amplified by the first amplifier to the main board.

2. The impedance measurement device of claim 1, wherein the main board comprises:
a power supply configured to provide a power;
a voltage measurement channel configured to measure a voltage for the AC signal received from the amplifier when receiving the AC signal from the amplifier;
a current measurement channel configured to measure a current for the AC signal received from the amplifier when receiving the AC signal from the amplifier; and
an impedance calculator configured to calculate an impedance by using the voltage for the AC signal and the current for the AC signal.

3. The impedance measurement device of claim 1, further comprising a plurality of amplifiers, and the main board is capable of performing multi-channel measurement by using signals received from each of the plurality of amplifiers.

\* \* \* \* \*